United States Patent
Chen et al.

(10) Patent No.: US 8,791,504 B2
(45) Date of Patent: Jul. 29, 2014

(54) SUBSTRATE BREAKDOWN VOLTAGE IMPROVEMENT FOR GROUP III-NITRIDE ON A SILICON SUBSTRATE

(75) Inventors: Chi-Ming Chen, Zhubei (TW); Po-Chun Liu, Hsinchu (TW); Hung-Ta Lin, Hsinchu (TW); Chin-Cheng Chang, New Taipei (TW); Chung-Yi Yu, Hsinchu (TW); Chia-Shiung Tsai, Hsinchu (TW); Ho-Yung David Hwang, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 229 days.

(21) Appl. No.: 13/277,692

(22) Filed: Oct. 20, 2011

(65) Prior Publication Data

US 2013/0099243 A1    Apr. 25, 2013

(51) Int. Cl.
    H01L 29/66    (2006.01)
(52) U.S. Cl.
    USPC ............ 257/194; 257/E29.247; 257/E21.403; 438/167

(58) Field of Classification Search
    None
    See application file for complete search history.

(56) References Cited

U.S. PATENT DOCUMENTS

| | | | |
|---|---|---|---|
| 7,485,512 B2 * | 2/2009 | Harris et al. | 438/167 |
| 2003/0013319 A1 * | 1/2003 | Holmes et al. | 438/761 |
| 2005/0263791 A1 * | 12/2005 | Yanagihara et al. | 257/194 |
| 2006/0073621 A1 * | 4/2006 | Kneissel et al. | 438/21 |
| 2008/0315255 A1 | 12/2008 | Maa et al. | |

* cited by examiner

Primary Examiner — Julio J Maldonado
Assistant Examiner — Sonya D McCall Shepard
(74) Attorney, Agent, or Firm — Lowe Hauptman & Ham, LLP

(57) ABSTRACT

A circuit structure includes a substrate, a nucleation layer of undoped aluminum nitride, a graded buffer layer comprising aluminum, gallium, nitrogen, one of silicon and oxygen, and a p-type conductivity dopant, a ungraded buffer layer comprising gallium, nitrogen, one of silicon and oxygen, and a p-type conductivity dopant without aluminum, and a bulk layer of undoped gallium nitride over the ungraded buffer layer. The various dopants in the graded buffer layer and the ungraded buffer layer increases resistivity and results in layers having an intrinsically balanced conductivity.

20 Claims, 2 Drawing Sheets

SUBSTRATE BREAKDOWN VOLTAGE IMPROVEMENT FOR GROUP III-NITRIDE ON A SILICON SUBSTRATE

TECHNICAL FIELD

This disclosure relates generally to semiconductor circuit manufacturing processes and, more particularly, to forming group-III group-V (III-V) compound semiconductor films on silicon substrate.

BACKGROUND

Group-III group-V compound semiconductors (often referred to as III-V compound semiconductors), such as gallium nitride (GaN) and its related alloys, have been under intense research in recent years due to their promising applications in electronic and optoelectronic devices. The large band gap and high electron saturation velocity of many III-V compound semiconductors also make them excellent candidates for applications in high temperature, high voltage, and high-speed power electronics. Particular examples of potential electronic devices employing III-V compound semiconductors include high electron mobility transistor (HEMT) and other heterojunction bipolar transistors.

Epitaxially grown films of the III-V compound semiconductor GaN are used in these devices. Unfortunately, GaN epitaxial films must be grown on substrates other than GaN because it is extremely difficult to obtain GaN bulk crystals due to the high equilibrium pressure of nitrogen at the temperatures typically used to grow bulk crystals. Owing to the lack of feasible bulk growth methods for GaN substrates, GaN is commonly deposited epitaxially on dissimilar substrates such as silicon, SiC and sapphire ($Al_2O_3$). Particularly, research is focused on using silicon as the growth substrate for its lower cost as compared to other growth substrates and subsequent processing capabilities. However, the growth of GaN films on silicon substrates is difficult, because silicon substrates have lattice constants and thermal expansion coefficients different than those of GaN. If the difficulties of growing GaN films on silicon substrates could be overcome, silicon substrates would be attractive for GaN growth given their low cost, large diameter, high crystal and surface quality, controllable electrical conductivity, and high thermal conductivity.

Improved methods for forming III-V compound semiconductor devices continue to be sought.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

Figure 1:
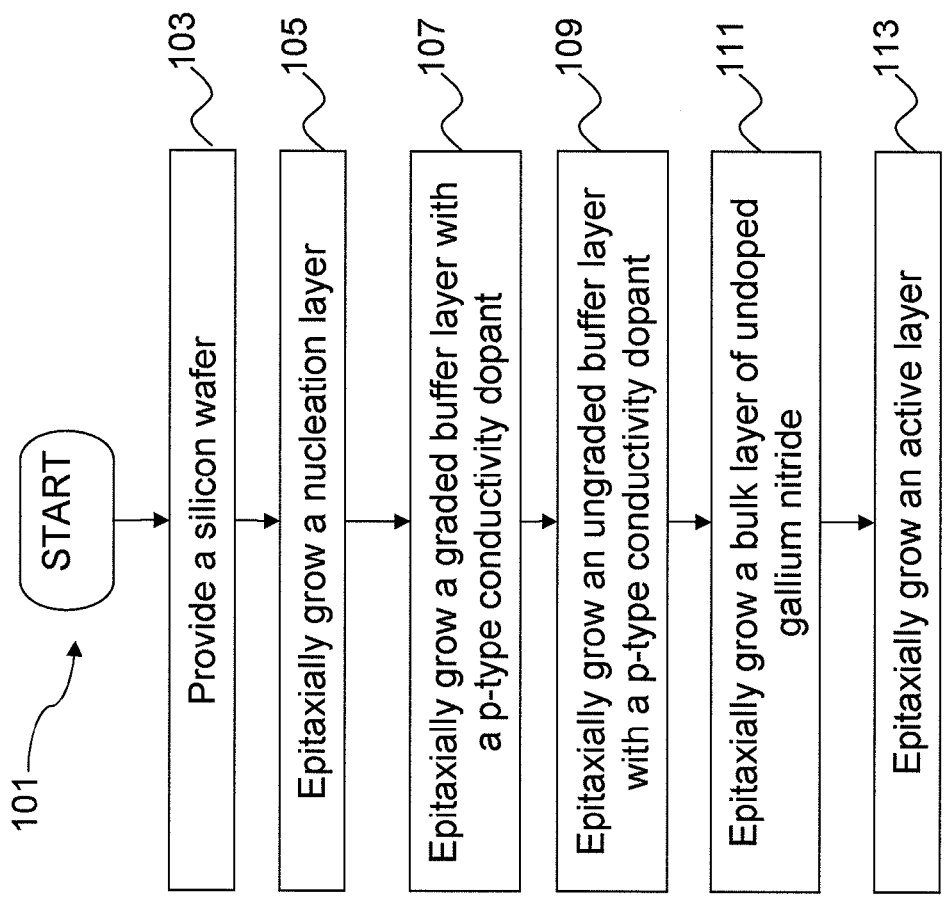
FIG. 1 is a process flow diagram showing operations in accordance with various embodiments of the present disclosure; and, FIG. 2 is a cross-sectional view of a circuit structure product in accordance with various embodiments of the present disclosure.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the invention and do not limit the scope of the disclosure.

A novel method for forming group-III to group-V (referred to as III-V hereinafter) semiconductor films and the resulting structures are provided. Throughout the description, the term "III-V compound semiconductor" refers to compound semiconductor materials comprising at least one group III element and one group-V element. The term "III-N compound semiconductor" refers to a III-V compound semiconductor in which the group V element is nitrogen. The required stages of manufacturing an illustrative embodiment of the present disclosure are illustrated. Those skilled in the art will recognize that other manufacturing steps may need to take place before or after the described stages in order to produce a complete device. Throughout the various views and illustrative embodiments of the present disclosure, like reference numbers are used to designate like elements.

As discussed, growing a thick GaN film, up to a few microns, for example, 5 microns, has many challenges including mismatching coefficients of thermal expansion (CTE) between the III-N material and silicon and mismatching lattice constants. One previous solution known to the inventors uses several layers of slightly different material to reduce the stresses at the interface between the silicon wafer and the group III-V compound semiconductor layer. On top of the silicon wafer a thin nucleation layer may be grown. For example, an aluminum nitride (AlN) layer with a thickness of about 150-300 nm may be grown on the silicon wafer. On the nucleation layer an undoped graded layer may be grown. In some cases, a graded layer would have a concentration gradient with reducing aluminum content and increasing gallium content. The graded layer may have a thickness of about 500 to 1000 nm with the top most gradient to be mostly gallium nitride. On the graded layer a bulk gallium nitride layer is deposited. The bulk gallium nitride layer can be deposited with less interfacial stress using the nucleation layer and the graded buffer layer; however, the bulk gallium nitride layer can only be deposited up to about 3 microns. A thicker bulk layer still results in breakage and excess defects. However, a sufficient breakdown voltage requires a thicker bulk layer.

The undoped graded layer and/or the bulk gallium nitride layer are found to exhibit electrical properties similar to that of n-doped layers. Through investigation and analysis, the inventors found that impurities such as silicon and/or oxygen are found in the undoped graded layer and/or the bulk gallium nitride layer. The impurities cause the layers to exhibit unwanted electrical properties that are detrimental to proper operation of high electron mobility transistor (HEMT) and other heterojunction bipolar transistors. The impurities are believed to be caused by residual contamination from the wafer processing environment.

The present disclosure provides a structure and a method to form III-V compound semiconductor films for a high breakdown voltage device and to correct the unintentional doping of silicon and/or oxygen. Referring now to FIG. 1, the flowchart of the method 101, at operation 103, a first silicon wafer is provided. The silicon wafer may have a crystal orientation having a Miller index of [111]. The silicon wafer may be between about 600 to about 1500 microns thick, for example, at about 675 microns. A thicker silicon wafer may be stronger and is less likely to break; however, the increased volume increases the bowing when the wafer is cooled. A thinner silicon wafer would suffer less bowing, but is less strong.

In operation 105 of FIG. 1, a nucleation layer is epitaxially grown on the silicon wafer. The nucleation layer may be about 100 nm to about 800 nm and include aluminum nitride. The nucleation layer may be grown using a low temperature epitaxial process. The process may be metal organic CVD (MOCVD), metal organic vapor phase epitaxy (MOVPE), plasma enhanced CVD (PECVD), remote plasma enhanced CVD (RP-CVD), molecular beam epitaxy (MBE), hydride vapor phase epitaxy (HVPE), chloride vapor-phase epitaxy (Cl-VPE), and liquid phase epitaxy (LPE). The low temperature process may involve a process temperature about 650 to about 950 degrees Celsius and a process pressure of about 300 Torr or greater. In another embodiment, the nucleation layer may be grown using a high temperature epitaxial process. The process temperature may be about 1000 to about 1200 degrees Celsius. The pressure may be between about 10 Torr to about 300 Torr.

Next, at operation 107, a buffer layer is grown on the nucleation layer with various dopants. The buffer layer includes a graded buffer layer and an ungraded buffer layer. Various semiconductor layers may be doped to change the intrinsically balanced conductivity. Depending on the material, some dopants may be added to cause the layer to have n-type or p-type conductivity. Depending on the type of material in the layer, one or more dopants may be added to cause the shift in the intrinsically balanced conductivity to be more n-type or more p-type. In addition to changing conductivity types, the dopants may also cause other electrical property changes. For example, the addition of dopants may increase resistivity.

In accordance with various embodiments of the present disclosure, the buffer layer may be doped with one or more of silicon and oxygen, and one or more of carbon, iron, magnesium, and zinc. The silicon and oxygen are known to be n-type dopants for the III-N material, and the carbon, iron, magnesium, and zinc are known to be p-type dopants for the III-N material. The two different types of dopants will compensate for (or cancel out) each other, resulting in an intrinsically balanced state similar to a pre-doped state for the graded buffer layer. While the electron and hole mobility for the buffer layer is at an intrinsically balanced state, the added dopants causes resistivity for the layer to increase, which results in a device with an increased breakdown voltage.

Varying the total dopant concentration increases the breakdown voltage by different amounts. The p-type dopants concentration of $1\ E^{15}/cm^3$ and $1\ E^{19}/cm^3$ may be desirable to achieve a sufficiently high breakdown voltage, for example, greater than about 800 volts. The resistivity for the layer may be higher than about $2\ E^4$ ohms-cm. A higher breakdown voltage may be achieved by increasing the total dopant concentrations. Note that in order to keep the buffer layer in an intrinsically balanced state, a corresponding concentration of silicon and/or oxygen is also included as dopants.

In some embodiments, the doping of the buffer layer with silicon and/or oxygen is unintentional. Impurities from the substrate, prior processing in the chamber or on the wafer, the environment, and elsewhere may be included in the buffer layer. The unintentional doping causes the buffer layer to have n-type conductivity. In these embodiments, only the p-type conductivity dopants are added during the epitaxial growth because the silicon and/or oxygen are expected to be present.

The p-type dopants are added during the epitaxial growth process as gases, which may be premixed with one or more of the precursor process gases or independently added. The p-type dopant concentration may vary across the layer. For example, the p-type dopant concentration may also be graded to be higher closer to the nucleation layer and lower further away from the nucleation layer.

In operation 107 of FIG. 1, a graded buffer layer of aluminum gallium nitride (AlGaN) is epitaxially grown on the nucleation layer with one or more p-type conductivity dopants. The graded buffer layer may have a thickness of about one to 3 microns. The graded buffer layer has a concentration gradient with reducing aluminum content and increasing gallium content. In other words, the portion of the graded buffer layer closest to the nucleation layer has the highest concentration of aluminum and the portion of the graded buffer layer furthest away from the nucleation layer has the lowest concentration of aluminum, in some cases, no aluminum. In some embodiments, the concentration of gallium varies in an opposite direction from the aluminum concentration. The gallium concentration closest to the nucleation layer is the lowest or zero, and the gallium concentration furthest from the nucleation layer is the highest.

In some embodiments, the concentration variation may occur stepwise in several layers. During epitaxial growth, the concentration variation may be achieved by switching on and off various gases and changing flow rates and pressures without removing the wafer-in-process from the chamber.

Referring back to FIG. 1, in operation 109 an ungraded buffer layer is epitaxially grown over the graded buffer layer. The ungraded buffer layer is gallium nitride without any aluminum. The ungraded buffer layer may be about 0.5 micron to about 3 micron thick. The graded buffer layer and the ungraded buffer layer together may be about 1 to about 5 microns thick, or about 3 microns thick.

The p-type dopant concentration in the graded buffer layer and the ungraded buffer layer may be different. In one example, the p-type dopant concentration varies within the graded buffer layer between $1\ E^{15}/cm^3$ and $1\ E^{19}/cm^3$. The p-type dopant concentration within the ungraded buffer layer is about $1\ E^{19}/cm^3$. In another example, the p-type dopant concentration varies throughout both the graded buffer layer and the ungraded buffer layer between $1\ E^{15}/cm^3$ and $1\ E^{19}/cm^3$, either gradually or in steps. In some cases, the concentration change may be affected by adding dopants without changing the gas flow rate of other dopants. In yet another example, the p-type dopant concentration is relatively constant throughout the buffer layer, for example, at about $1\ E^{19}/cm^3$.

In operation 111, a bulk layer of undoped gallium nitride is epitaxially grown over the ungraded buffer layer. The bulk layer of gallium nitride does not include any dopant, but may include contaminants or impurities that are incorporated in the film unintentionally. The undoped gallium nitride may be about 0.5 microns to about 1 micron thick. The bulk GaN layer is grown under high temperature conditions. The process may be metal organic CVD (MOCVD), metal organic vapor phase epitaxy (MOVPE), plasma enhanced CVD (PECVD), remote plasma enhanced CVD (RP-CVD), molecular beam epitaxy (MBE), hydride vapor phase epitaxy (HVPE), chloride vapor-phase epitaxy (Cl-VPE), and liquid phase epitaxy (LPE). Using metal organic vapor phase epitaxy (MOVPE) using gallium-containing precursor and nitrogen-containing precursor. The gallium-containing precursor includes trimethylgallium (TMG), triethylgallium (TEG), or other suitable chemical. The nitrogen-containing precursor includes ammonia ($NH_3$), trimethylalaluminum (TMA), phenyl hydrazine, or other suitable chemical.

Figure 2:
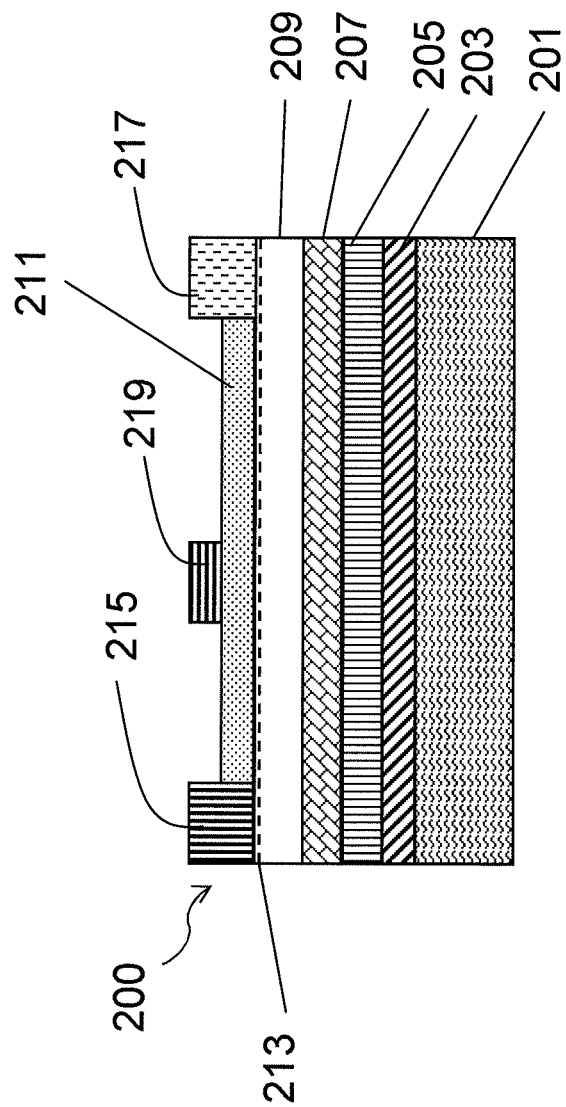

FIG. 2 shows an example power transistor device 200 according to various embodiments of the present disclosure. The substrate 201 is a silicon substrate with a crystal orientation of [111]. Although silicon wafers with other crystal orientations may be used, it has been found that the [111] silicon wafer is well suited for subsequent epitaxial growth of III-V material. A nucleation layer 203 of aluminum nitride, about 300 nm thick, is grown on the substrate 201 using a low temperature or a high temperature process. A buffer layer (205 and 207) is grown over the nucleation layer. A first buffer layer portion 205, about 2 microns thick, is the graded buffer layer (AlGaN) with concentration gradients of aluminum and gallium. The composition may be defined as $Al_x(Ga_{1-x})N$, with x varying from 1 to 0 or 1 to 0.2, between the nucleation layer and the second buffer layer portion. The variation may be a smooth concentration curve, a straight line, or several step changes.

A second buffer layer portion 207 is epitaxially grown over the graded buffer layer 205. The second buffer layer is ungraded. The epitaxial growth includes only gallium nitride containing precursors without using aluminum containing precursors. However, trace amounts of aluminum may still be found in this layer due to contamination or migration from the graded buffer layer 205. The ungraded buffer layer may be about 1 micron thick.

A bulk gallium nitride layer 209 is then grown over the ungraded buffer layer 207. The bulk gallium nitride layer 209 is a channel layer for the power transistor device, which may be a high electron mobility transistor (HEMT). FIG. 2 shows an active layer 211 on top of the bulk GaN layer 209. The active layer 211, also referred to as donor-supply layer, is grown on the channel layer 209. An interface is defined between the channel layer 209 and the donor-supply layer 211. A carrier channel 213 of two-dimensional electron gas (2-DEG) is located at the interface. In at least one embodiment, the donor-supply 211 refers to an aluminum gallium nitride (AlGaN) layer (also referred to as the AlGaN layer 211). The AlGaN layer 211 can be epitaxially grown on the GaN layer 209 by MOVPE using an aluminum-containing precursor, a gallium-containing precursor, and a nitrogen-containing precursor. The aluminum-containing precursor includes TMA, TEA, or other suitable chemical. The gallium-containing precursor includes TMG, TEG, or other suitable chemical. The nitrogen-containing precursor includes ammonia, tertiarybutylamine (TBAm), phenyl hydrazine, or other suitable chemical. The AlGaN layer 211 has a thickness in a range from about 5 nanometers to about 50 nanometers and includes aluminum concentration of between about 0.15 to 0.3%. In other embodiments, the donor-supply layer 211 may include an AlGaAs layer, or AlInP layer.

The band gap discontinuity exists between the AlGaN layer 211 and the GaN layer 209. The electrons from a piezo-electric effect in the AlGaN layer 211 drop into the GaN layer 209, creating a very thin layer 213 of highly mobile conducting electrons in the GaN layer 209. This thin layer 213 is referred to as a two-dimensional electron gas (2-DEG), forming a carrier channel (also referred to as the carrier channel 213). The thin layer 213 of 2-DEG is located at an interface of the AlGaN layer 211 and the GaN layer 209. Thus, the carrier channel has high electron mobility because the GaN layer 209 is undoped or unintentionally doped, and the electrons can move freely without collision or substantially reduced collision with the impurities.

The semiconductor structure 200 also includes a source feature 215 and a drain feature 217 disposed on the AlGaN layer 211 and configured to electrically connect to the carrier channel 213. Each of the source feature and the drain feature comprises a corresponding intermetallic compound. The intermetallic compound is at least partially embedded in the AlGaN layer 211 and a top portion of the GaN layer 209. In one example, the intermetallic compound comprises Al, Ti, or Cu. In another example, the intermetallic compound comprises AN, TiN, $Al_3Ti$ or $AlTi_2N$.

The intermetallic compound may be formed by constructing a patterned metal layer in a recess of the AlGaN layer 211. Then, a thermal annealing process may be applied to the patterned metal layer such that the metal layer, the AlGaN layer 211 and the GaN layer 209 react to form the intermetallic compound. The intermetallic compound contacts the carrier channel 213 located at the interface of the AlGaN layer 211 and the GaN layer 209. Due to the formation of the recess in AlGaN layer 211, the metal elements in the intermetallic compound may diffuse deeper into the AlGaN layer 211 and the GaN layer 209. The intermetallic compound may improve electrical connection and form ohmic contacts between the source/drain features and the carrier channel 213. In one example, the intermetallic compound is formed in the recess of the AlGaN layer 211 thereby the intermetallic compound has a non-flat top surface. In another example, intermetallic compound overlies a portion of the AlGaN layer 211.

The semiconductor structure 200 also includes a gate 219 disposed on the AlGaN layer 211 between the source 215 and drain 217 features. The gate 219 includes a conductive material layer which functions as the gate electrode configured for voltage bias and electrical coupling with the carrier channel 213. In various examples, the conductive material layer may include a refractory metal or its compounds, e.g., tungsten (W), titanium nitride (TiN) and tantalum (Ta). In one example, the gate 219 is directly disposed on the AlGaN layer 211. In another example, a dielectric layer (not shown) is formed between the gate 219 and the AlGaN layer 211. The dielectric layer may include silicon oxide ($SiO_2$), silicon nitride ($Si_3N_4$), aluminum oxide ($Al_2O_3$), tantalum oxide ($Ta_2O_5$), titanium oxide ($TiO_2$), zinc oxide ($ZnO_2$) or hafnium oxide ($HfO_2$). The dielectric layer has a thickness in a range from about 3 nm to about 500 nm. The dielectric layer provides isolation to prevent gate leakage and further improve device switching speed.

The semiconductor structure 200 also includes an insulating layer (not shown) disposed between gate 219 and the source/drain features (namely the intermetallic compound). The insulating layer covers the source/drain features and exposes a portion of the source/drain features to form functional circuitry. The gate 219 is at least partially embedded in the insulating layer.

The HEMT 200 includes a relatively thick layer of bulk gallium nitride, which allows high power operation with voltages greater than a hundred volts and very high breakdown voltage at 800 volts or greater. The channel has very low resistivity, which allows very high frequency operation. Electrical properties of gallium nitride based HEMT compared favorably to silicon and silicon carbide based devices and with very competitive costs. Specifically, low gate capacitance and low on-resistance permits much higher frequency switching converters than competing silicon-based transistors. The present disclosure provides a structure and method to form the thick gallium nitride layer with less strain and defects.

The embodiments of the present disclosure may have other variations. For example, one or more additional layers of the III-V compound semiconductor layers may be formed to further improve the quality of the resulting III-V compound semiconductor layers. Certain embodiments of the present disclosure have several advantageous features. The use of various doping species allows fine-tuning of the resistivity of the layers, and hence the breakdown voltage, while maintaining the layers in an intrinsically balanced conductivity state. In unbalanced situations, either a greater influence of n-type or p-type dopants, the channel operation would be adversely affected. Hence the quality of the HEMT device is improved.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
   a silicon substrate;
   a nucleation layer of undoped aluminum nitride over the silicon substrate;
   a buffer layer comprising gallium, nitrogen, one of silicon or oxygen, and a p-type conductivity dopant over the nucleation layer, wherein the buffer layer comprises a graded buffer layer and an ungraded buffer layer, said graded buffer layer further comprising aluminum; and,
   a bulk layer of undoped gallium nitride over the buffer layer.

2. The device of claim 1, wherein the p-type conductivity dopant comprises at least one of carbon, iron, magnesium, and zinc.

3. The device of claim 1, wherein the p-type conductivity dopant in the buffer layer is an impurity having a total concentration of between about 1 E15/cm3 and 1 E 19/cm3.

4. The device of claim 1, wherein the p-type conductivity dopant in the ungraded buffer layer and the graded buffer layer is different with respect to composition and/or concentration.

5. The device of claim 1, wherein the buffer layer is about 1 to about 3 microns thick.

6. The device of claim 1, wherein the ungraded buffer layer is about 0.5 to about 3 microns thick.

7. The device of claim 1, further comprising an active layer over the bulk layer, the active layer including a layer of aluminum nitride and a layer of aluminum gallium nitride.

8. The device of claim 7, wherein the aluminum nitride active layer is about 5 to about 15 angstroms and the aluminum gallium nitride active layer is about 100 to about 350 angstroms.

9. The device of claim 7, wherein the aluminum gallium nitride active layer includes an aluminum concentration of between about 0.15 to 0.3% atomic percent.

10. The device of claim 1, wherein the bulk layer is about 0.5 microns to about 1 microns thick.

11. The device of claim 1, wherein the one of silicon or oxygen and the p-type conductivity dopant have total concentrations such that electron and hole mobility for the buffer layer is at an intrinsically balanced state.

12. The device of claim 1, wherein the p-type conductivity dopant in the buffer layer is an impurity having a varying concentration across the buffer layer.

13. The device of claim 12, wherein the varying concentration across the buffer layer comprises a higher concentration closer to the nucleation layer and a lower concentration farther away from the nucleation layer.

14. The device of claim 1, wherein they-type conductivity dopant in the buffer layer is an impurity having a substantially constant concentration throughout the buffer layer.

15. The device of claim 1, wherein the graded buffer layer further comprises a concentration gradient of aluminum.

16. The device of claim 1, wherein the graded buffer layer further comprises a concentration gradient of gallium.

17. A device comprising:
    a silicon substrate;
    a nucleation layer of undoped aluminum nitride over the silicon substrate;
    a buffer layer comprising gallium, nitrogen, one of silicon or oxygen, and a p-type conductivity dopant over the nucleation layer;
    a bulk layer of undoped gallium nitride over the buffer layer; and
    an active layer over the bulk layer,
    wherein the buffer layer comprises a graded buffer layer and an ungraded buffer layer, said graded buffer layer further comprising a aluminum.

18. The device of claim 17, wherein the active layer comprises at least one of aluminum gallium nitride, aluminum gallium arsenide, or aluminum indium phosphide.

19. The device of claim 17, further comprising a carrier channel between the bulk layer and the active layer.

20. The device of claim 17, wherein the graded buffer layer further comprises a concentration gradient of aluminum.

* * * * *